United States Patent [19]

Ligthart et al.

[11] Patent Number: 5,224,103
[45] Date of Patent: Jun. 29, 1993

[54] PROCESSING DEVICE AND METHOD OF PROGRAMMING SUCH A PROCESSING DEVICE

[75] Inventors: Michael M. Ligthart, Sunnyvale, Calif.; Peter G. Baltus, Schinveld, Netherlands

[73] Assignee: North American Philips Corporation, New York, N.Y.

[21] Appl. No.: 553,039

[22] Filed: Jul. 16, 1990

[51] Int. Cl.$^5$ .................. G06F 11/00; H04B 17/00
[52] U.S. Cl. ........................ 371/22.4; 371/21.1
[58] Field of Search ............ 371/22.4, 10.1, 21.1, 371/40.1, 19, 20.4, 20.5; 364/267.4

[56] References Cited

U.S. PATENT DOCUMENTS

| | | | |
|---|---|---|---|
| 4,194,113 | 3/1980 | Fulks et al. | 371/22.4 |
| 4,490,783 | 12/1984 | McDonough et al. | 364/200 |
| 4,817,093 | 3/1989 | Jacobs et al. | 371/22.3 |
| 4,903,266 | 2/1990 | Hack | 371/22.4 X |

FOREIGN PATENT DOCUMENTS 0018736 11/1980 European Pat. Off. .

OTHER PUBLICATIONS

Hunger, A., "Selbsttest von Mikroprozessoren auf der Basis des Befehlssatzes", Rheinisch-Westfälischen Tech. Hochschule Aachen, vol. 82, 1983, pp. 20-23 [Only Abstract Considered].
Theus, U. et al., "A Self Testing ROM Device", IEEE ISSCC, 1981 Digest of Technical Papers, pp. 176-177.
Winkelmann, C. A. et al., "Microprocessor Self-Testing for Mine Monitor Systems", IEEE Transactions on Industry Application, vol. IA-21, No. 1, 1985, pp. 158-161.
Meyer et al., "ROM-Test von Ein-Chip-Mikrocomputem", Elektronik-Application, vol. 14, No. 10, Oct. 1982, pp. 52-55 [Only Abstract Considered].
Nuez et al., "Self-Test on a Read-only Memory", *IBM TDB*, Feb. 1985, p. 5338.
M. M. Ligthart, P. Baltus & M. Freeman, "RPST: A ROM Based Pseudo-Exhaustive Self Test Approach", IEEE Proc. ITC 1987, pp. 915-922.
J. Kuban and H. Bruce, "The MC6804P2 built-in self-test", IEEE Proc. ITC 1983, pp. 295-300.
C. S. Gloster and F. Brglez, "Boundary Scan with Built-in Self-test", IEEE Design and Test of Computers, Feb. 1989, pp. 36-44.

*Primary Examiner*—Robert W. Beausoliel, Jr.
*Assistant Examiner*—Allen M. Lo
*Attorney, Agent, or Firm*—Anne E. Barschall

[57] ABSTRACT

A programmable processing device has a built-in a program memory (14) for storage of data including program instructions for controlling a functional unit (20) of the device. The device also includes signature generating means (18) for combining data read from all locations of the memory (14) during a memory test sequence, to generate a signature word which can be used to verify correct programming and operation of the memory. The device includes means for supplying the generated signature word to an instruction decoding means (20) at the end of the memory test sequence for execution as a normal program instruction. The signature word thus directly determines subsequent operation of the device, enabling the verification result to be communicated externally without the need for a dedicated data path for communicating the signature value itself outside the device. Any desired signature word/instruction can be achieved by including a seed word in the stored data.

11 Claims, 4 Drawing Sheets

PROCESSING DEVICE AND METHOD OF PROGRAMMING SUCH A PROCESSING DEVICE

FIELD OF THE INVENTION

The invention relates to processing devices with built-in memory self-test facilities. The invention relates in particular to a processing device comprising:
- a program memory for storage of data including program instructions for controlling the device;
- instruction decoding means for controlling the operation of the processing device in accordance with instructions read from the program memory;
- memory test sequencing means for implementing a memory test sequence wherein all locations in a to-be-tested part of the memory are systematically addressed to cause readout of the data stored in that part of the memory; and
- signature generating means for combining the data read from the memory during said memory test sequence to generate a signature word.

The invention further relates to a method of programming such a processing device and to a processing device when programmed by such a method.

BACKGROUND ART

Programmable processing devices are today used in a wide variety of applications, and typically comprise program controlled functional units integrated with program memory and/or microprogram memory on a single integrated circuit chip. It is generally required to allow verification of the program data stored on chip. However, transferring the entire memory contents to the test equipment for verification may require excessive dedicated test hardware on-chip, and requires expensive test equipment. To reduce this problem, devices having built-in self-test features have been developed in which the stored data are compressed on-chip into a so-called signature word which can be used to verify the entire memory contents with an adequate degree of certainty.

An example of a processing device with a built-in memory self-test facility, as set forth in the opening paragraph, has been described by M. M. Ligthart, P. Baltus and M. Freeman in "RPST: A ROM based Pseudo-exhaustive Self Test approach", IEEE Proc. ITC 1987, pp. 915-922. Another example is described by J. Kuban and H. Bruce in "The MC6804P2 built-in self-test", IEEE Proc. ITC 1983, pp. 295-300. In the known devices, only the generated signature word needs to be transferred off-chip, to be compared to the expected signature word. There is still a need for external knowledge of the expected signature word, and a need for dedicated data paths for communication of the signature word.

SUMMARY OF THE INVENTION

It is an object of the invention to enable the provision of a processing device in which a self-test facility is more highly automated and/or integrated within the device than is the case in known devices.

The invention provides a processing device as set forth in the opening paragraph, characterized by means for supplying the generated signature word to the instruction decoding means at the end of the memory test sequence for execution as a program instruction. By this means, the signature word can directly determine subsequent operation of the device, without itself being transmitted outside the device. This is particularly advantageous when the device is constructed as an integrated circuit.

The expected signature word may, for example, serve as an instruction causing output of a confirmation signal by means of output devices already present in the device, rather than requiring a dedicated data path for communication of the signature word to external test apparatus. Equipment manufacturers for example can thereby take advantage of the self-test facility when incorporating the device in their equipment, without themselves providing expensive test equipment.

The signature generating means may be formed during the memory test sequence by temporary reconfiguration of at least a part of the instruction decoding means. As an example:
- the instruction decoding means may include an instruction register for receiving and storing data read from the memory; while
- in the temporarily reconfigured instruction decoding means forming the signature generating means the instruction register forms part of a linear feedback shift register.

Using part of the decoding means as the signature generating means may provide further economy of circuitry. Furthermore, the means for supplying the signature word to the decoding means may be provided without additional hardware in such an embodiment: the signature value can simply remain in the register while the function of the circuitry changes from signature generating means to instruction decoding means.

In one such embodiment:
- the instruction decoding means is responsive to a jump type of instruction specifying the location of program instructions to be executed subsequently; and
- the memory test sequencing means includes means for inhibiting the response to jump instructions during the memory test sequence.

This allows use of a single address generating means during both normal operation and the memory test sequence, while ensuring that all locations are addressed during the test sequence in a predictable manner.

The memory test sequencing means may be arranged to initiate the test sequence in response to an externally generated control signal applied to the device. Alternatively, the test sequence might be initiated automatically, for example whenever power is newly applied to the device.

The invention further provides a method of programming a processing device, the method comprising:
- receiving given data for storage in a program memory of the device;
- selecting as a desired signature word a word suitable for execution as a program instruction for controlling the operation of the processing device;
- calculating from the given data a seed word which, when combined with the given data by a signature generating means of the device during a memory test sequence, will cause generation of the desired signature word;
- storing the given data in the program memory of the processing device; and
- storing the seed word in the processing device for supply to the signature generating means during the memory test sequence.

By use of a seed word in the signature generation, any desired instruction can be encoded by the signature word (assuming the memory test reveals no errors in the stored data), independently of the given data, which are determined by functional considerations.

The seed word may be stored together with the given data in the memory of the processing device, or it may be stored in some other part of the device.

The desired signature word may for example constitute a jump instruction for causing the processing device to execute program instructions included in the given data. These program instructions may comprise a main application program for the device, or they may comprise a further test program for testing other parts of the device and/or for communicating the result of the memory test sequence outside the device.

The invention still further provides a processing device when programmed by a method in accordance with the invention as set forth above.

BRIEF DESCRIPTION OF THE DRAWINGS

Embodiments of the invention will now be described, by way of example, with reference to the accompanying drawings, in which.

DETAILED DESCRIPTION OF THE EMBODIMENTS

Figure 1:
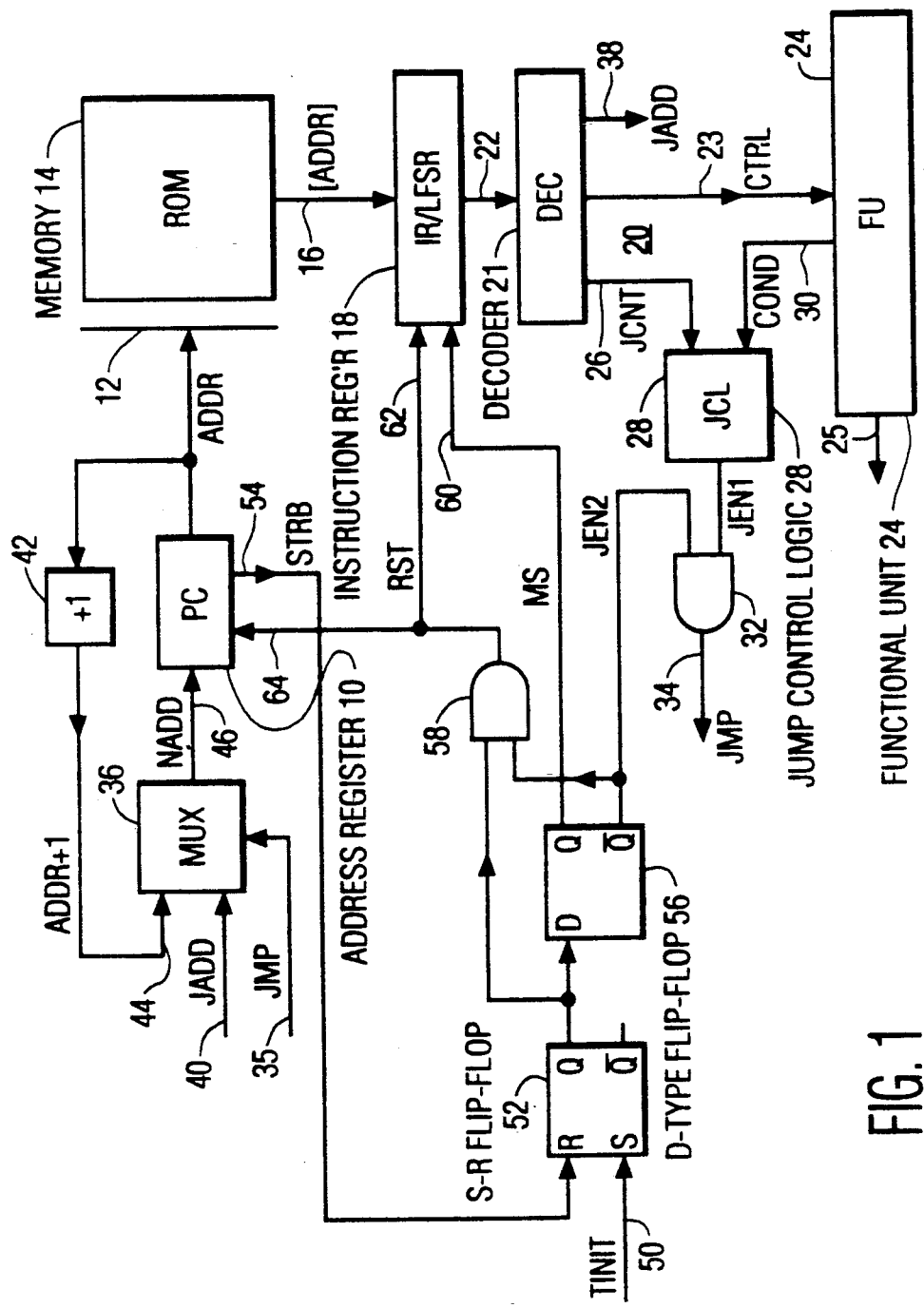
FIG. 1 shows in block schematic form a processing device constructed in accordance with the present invention.

FIG. 1 shows a processing device wherein an address register 10 (PC) supplies an address word ADDR to an address input 12 of a read-only memory 14 (ROM), which contains data including program instructions for controlling the operation of the device. The memory 14 has an n-bit data output 16 which reproduces an n-bit data word [ADDR] stored within the memory 14 at a location addressed by the address word ADDR, where n may be for example 8, 16, 32 or any other number of bits. The data output 16 of the memory 14 is connected to a dual purpose instruction register 18 (IR/LFSR) which forms a first stage of an instruction decoding means 20. The instruction register 18 will be described in more detail below, with reference to FIG. 2.

The instruction register 18 has an n-bit output 22 which is connected to an input of a decoder 21. The decoder 21 has an output 23 which supplies control word CTRL to a functional unit 24 (FU) of the processing device. The internal structure of the functional unit 24 is determined by the purpose of the processing device itself. The device may for example form a general purpose microcomputer, in which case the functional unit 24 may include one or more arithmetic and logic units (ALU's), storage registers and interface elements for input and output. One output port 25 is shown, for the sake of example, but the internal structure of the functional unit 24 need not be described in detail for an understanding of the present invention.

The decoder 21 also has an output 26 which supplies a jump control signal JCNT (one or more bits) to a first input of a jump control logic circuit 28 (JCL). The functional unit 24 has an output 30 which supplies a jump condition signal JCON (one or more bits) to a second input of the jump control logic circuit 28. An output of the circuit 28 supplies a first jump enable signal JEN1 to a first input of an AND gate 32, whose output 34 supplies a jump signal JMP to a control input 35 of an address multiplexer 36 (MUX). The decoder 21 has a further output 38 which supplies a jump address word JADD to a first address input 40 of the multiplexer 36. An adder 42 receives the address word ADDR from the output of the address register 10, adds one to it, and supplies the value ADDR+1 to a second address input 44 of the multiplexer 36. An output 46 of the multiplexer 36 supplies a next address word NADD to an input of the address register 10.

The device has an input 50 for receiving an externally generated test initiation signal TINIT. The input 50 is connected to a set input (S) of an S-R flip-flop 52. A reset input (R) of the flip-flop 52 receives a strobe signal STRB from an output 54 of the address register 10. A non-inverted output (Q) of the flip-flop 52 is connected to a data input (D) of a D-type flip-flop 56 and also to a first input of a further AND gate 58. A non-inverted output (Q) of the flip-flop 56 supplies a mode select signal MS to a mode select input 60 of the instruction register 18. An inverted output ($\overline{Q}$) of the flip-flop 56 supplies a second jump enable signal JEN2 to a second input of the AND gate 32 and also to a second input of the further AND gate 58. The signal JEN2 is always the complement of the mode select signal MS (JEN2=$\overline{MS}$).

An output of the further AND gate 58 supplies a reset signal RST to a reset input 62 of the instruction register 18 and also to a reset input 64 of the address register 10. The various flip-flops and registers of the device of FIG. 1 are synchronized by means of clock signals (not shown), in a manner well known to those skilled in the art.

Figure 2:
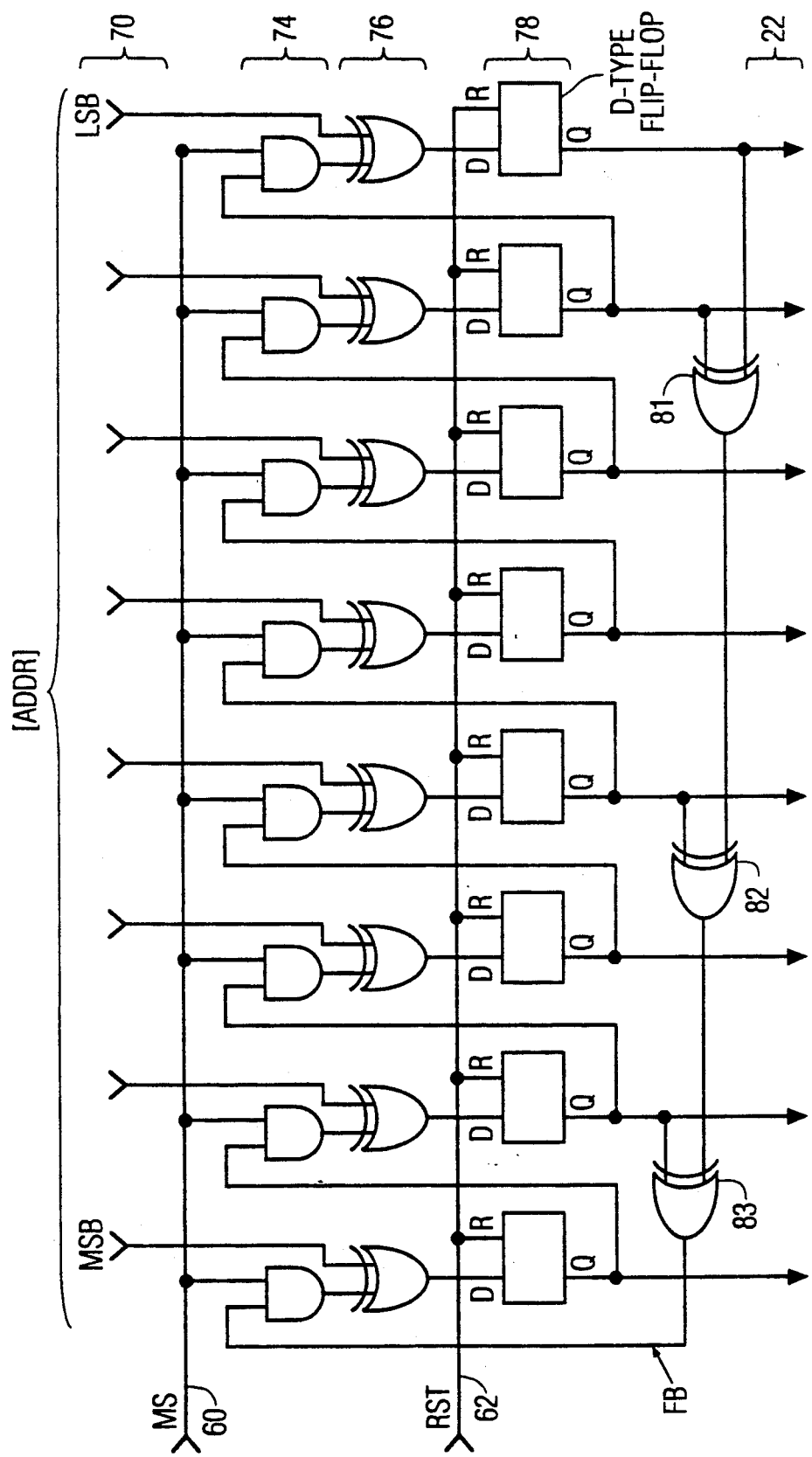
FIG. 2 shows in more detail a part of the device of FIG. 1.

FIG. 2 shows the internal structure of the instruction register 18 in an exemplary embodiment where n=8. The instruction register of FIG. 2 comprises n (eight) dual input AND gates 74, n Exclusive-OR (EXOR) gates 76 and n (clocked) D-type flip-flops 78. The n separate bit signals forming the data word [ADDR] are received by n inputs 70, ranging from the most significant bit (msb) at the left in FIG. 2, to the least significant bit (lsb) at the right. Each bit input 70 is connected to a first input of a respective EXOR gate 76. The output of each EXOR gate 76 is connected to a data input (D) of a respective flip-flop 78. Each flip-flop 78 has a data output (Q) which forms a respective bit of the n-bit output 22.

The output of each flip-flop 78, excluding the lsb flip-flop, is connected to a first input of a respective AND gate 74, which has its output connected to a second input of the EXOR gate 76 whose output feeds the flip-flop 78 corresponding to the next bit, in order of decreasing significance. Three further EXOR gates 81, 82 and 83 in cascade combine the lsb of the output 22 with the second, fourth and seventh least significant bits of the output 22 to generate a feedback signal FB which is supplied to a first input of the AND gate 74 corresponding to the msb. The second input of every AND gate 74 receives the mode select signal from the input 60, and every flip-flop 78 has a reset input (R) which receives the reset signal RST from the input 62.

The operation of the instruction register shown in FIG. 2 will be described before describing the operation of the processing device as a whole. The instruction register has two modes of operation: a register mode, selected by the signal MS=0, and a signature generator mode, selected by the signal MS=1. In register mode, the signal MS=0 at the second input of each AND gate 74 holds the output of the gate at 0, regardless of the value applied to the first input of the gate. The EXOR gates 76 therefore act simply to transmit the bits of the data word [ADDR] unchanged to the data inputs of the respective flip-flops 78. At each clock cycle, the data word [ADDR] is simply latched and reproduced at the output 22 for use by the decoder 21.

In the signature generator mode, with MS=1, each AND gate 74 transmits the value at its first input to the second input of the corresponding EXOR gate 76. This reconfigures the instruction register so that it forms a linear feedback shift register (LFSR) wherein, at each clock cycle, the data word [ADDR] is combined with the word already contained in the flip-flops 78 to form a new word. A reset signal RST=1 applied to the reset inputs of the flip-flops 78 via the reset input will force all flip-flops to '0'. In any subsequent clock cycle, the word contained in the instruction register 18 is a known function of all bits of all of the data words [ADDR] applied to the inputs 70 since the reset, and this word constitutes the signature word of those data words.

The processing device as described so far operates to generate a signature word for verifying the contents of the memory 14 in a manner similar to that described for testing the memory contents in the references Ligthart et al and Kuban et al. However, the novel device avoids the need for communicating the signature word to external equipment for comparison with a desired signature word in a manner to be described below with reference to the flowchart of FIG. 3.

Figure 3:
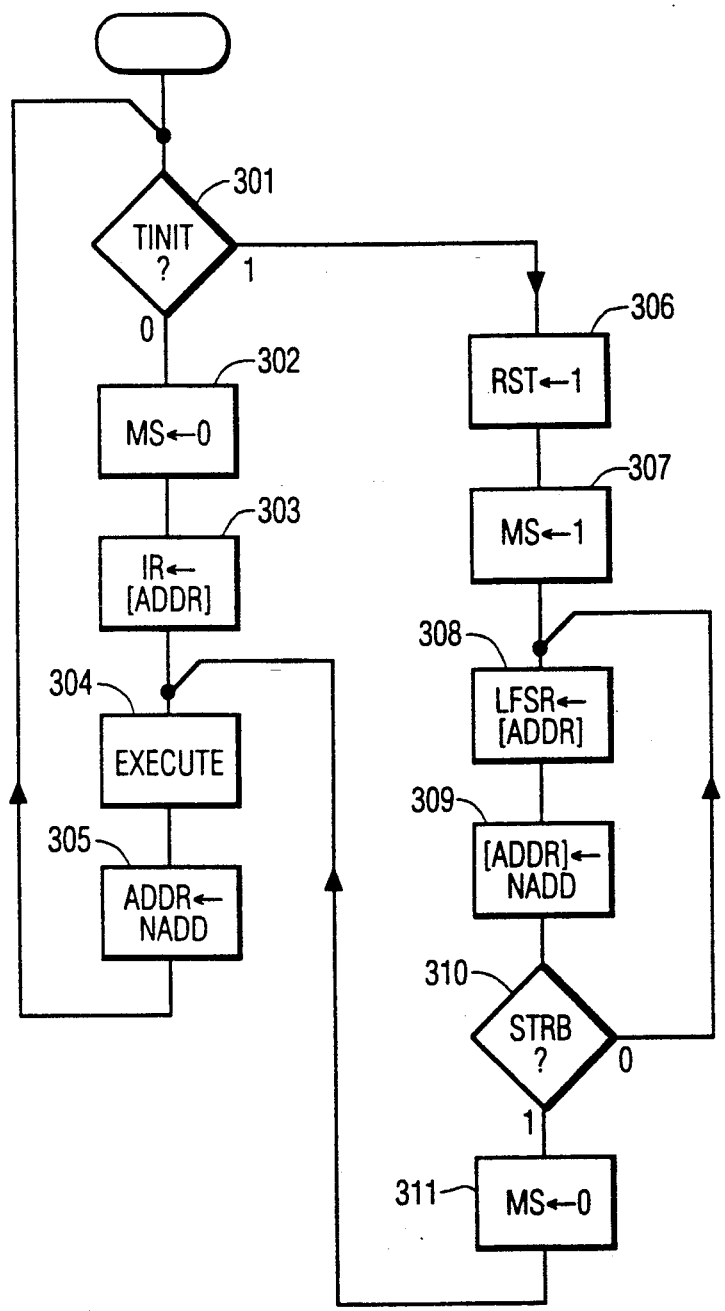
FIG. 3 is a flowchart illustrating operation of the processing device of FIGS. 1 and 2.

The flowchart of FIG. 3 illustrates the sequences of events that characterize the normal and memory test modes of the device of FIG. 1. The actual timing of the various events, in clock cycles or otherwise, is not represented except as expressly described below. In each clock cycle, the device tests (step 301) the externally generated initiation signal TINIT (input 50) to determine whether a self-test of the data stored in the memory 14 is to be performed. Assuming that no memory test is required (TINIT remains 0), the Q output of the S-R flip-flop 52 remains 0, and the flip-flop 56 generates complementary signals MS=0 and JEN2=1. Thus the device operates in a "normal" mode: the instruction register 18 operates as a simple n-bit register (step 302), rather than as a linear feedback shift register. The reset signal RST generated by the AND gate 58 is held at 0.

In the normal mode (TINIT=0, MS=0, JEN2=1, RST=0), the device operates as a conventional programmed processing device, with the address register 10 operating as a program counter (PC) register to cause readout of instructions and data from the memory 14, while the functional unit 24 performs desired functions in accordance with those instructions.

In step 303, the data word [ADDR] stored in the memory 14 at address ADDR is latched by the instruction register 18 and hence supplied as an instruction word to the decoder 21 via the output 22 of the register 18. In a simple device, the control signals generated by the decoder 21 may simply be respective bits of the instruction word. In step 304, the decoder 21 generates from the data word [ADDR] the control word CTRL (output 23) by which the operations of the functional unit are controlled. Thus the data word [ADDR] acts as a program instruction for the device. The decoder may also however comprise more complex combinational and/or sequential logic, for example to "pipeline" different stages of instruction execution, in a manner well known to those skilled in the art.

At each clock cycle, the next address word NADD is latched (step 305) by the address register 10 to become the address word ADDR currently applied to the address input 12 of the memory 14. Assuming for the moment that the jump signal JMP applied to the multiplexer 36 is 0, then the multiplexer 36 will select ADDR+1 from its input 44 to form the next address NADD. In this manner, locations in the memory 14 are addressed sequentially in successive clock cycles.

A special type of program instruction is a jump instruction, causing a branch in the program execution. The decoder 21 derives the jump control signal JCNT (output 26) from the data word [ADDR] to inform the jump control logic circuit 28 that a jump instruction is to be executed. Many jump instructions will be conditional on variables such as register values, arithmetic or logic test results and so forth. For this purpose, the control word CTRL specifies to the functional unit 24 the condition for the jump, and the unit 24 in turn supplies the condition signal COND (output 30) to the circuit 28, to indicate whether the condition is satisfied.

If the jump condition is satisfied, the circuit 28 generates a positive first jump enable signal JEN1=1. Since, in normal mode, the second jump enable signal JEN2 is also 1, the AND gate 32 generates a positive jump signal JMP=1. This causes the address multiplexer 36 to switch to its first input 40 (JADD), so that the next address word NADD in the address register 10 will be the jump address word JADD supplied by the output 38 of the decoder 21, and not ADDR+1. If the instruction word [ADDR] is long enough, the decoder 21 may derive the jump address word JADD directly from a bit field in the jump instruction word [ADDR]. Otherwise, sequential logic in the decoder 21 may derive the jump address JADD from a data word or words stored in the memory 14 as operands in locations following a generic jump operation code (opcode).

Once next address word NADD (defined by ADDR+1 or by JADD) is latched in step 305 to become the new address word ADDR, operation of the device returns via steps 301 and 302 to step 303 where the next instruction is read from the memory 14, executed in step 304, and so on, for so long as the device remains in normal mode (TINIT=0).

Considering now the situation where a positive test initiation signal TINIT=1 is detected in step 301, then on the next clock cycle, the Q output of the S-R flip-flop 52 will become 1. Since the signal JEN2 at the $\overline{Q}$ output of the flip-flop 56 remains high at this time, the reset signal RST produced by the further AND gate 58 goes to 1 (step 306). The signal RST=1 causes the instruction register 18 to be reset to 0's, and also causes the address register 10 to reset to some predetermined value of ADDR, say ADDR0, which identifies the first location in the memory 14 which it is desired to test (for example: ADDR0=0000).

On the second clock cycle following the initiation signal TINIT=1, the Q output of the flip-flop 56 goes to 1, causing the mode select signal MS=1 to be applied to the input 60 of the instruction register 18 (step 307), causing a transformation of the instruction register 18 into a signature generating means in the form of a linear feedback shift register (LFSR), as described above with reference to FIG. 2. At the same time, the second jump enable signal JEN2=0 is generated at the output of the flip-flop 56. This causes the reset signal RST to return to 0, and also prevents the AND gate 32 from generating a positive jump signal JMP=1. The jump mechanism is therefore inhibited in the memory test mode, so that the next address word NADD is always ADDR+1 regardless of the data words [ADDR] applied to the decoder 21. The signals MS and/or JEN2 may also be supplied to the functional unit 24 to disable other elements of the device, for example to prevent the generation of spurious signals by the output port 25 during the memory test sequence.

During said second cycle, the data word [ADDR0] stored in the first location to be tested is received from the output 16 of the memory 14 by the instruction register 18, and combined with the existing word (all 0's) as a first step in the signature calculation. On each following cycle, the next address word NADD=ADDR+1 becomes the present address word ADDR (step 309). Providing that the strobe signal STRB remains 0, a loop comprising steps 308 and 309 is implemented (step 310) so that the data word [ADDR] stored in every location ADDR in the memory 14 is applied in turn to the instruction register 18, where it contributes to the signature word represented by the state of that register.

Two cycles before the last address to be tested (say ADDRN) is being generated by the address register 10, this is detected and the register 10 generates a positive strobe signal STRB=1 in response. The strobe signal STRB=1 acts via the flip-flop 52 and the flip-flop 56 so that the signals MS and JEN2 return to 0 and 1 respectively in the cycle when ADDR=ADDRN. The device therefore reverts to the normal mode, wherein the instruction register 18 functions as a simple n-bit flip-flop (step 311), and a positive first jump enable signal JEN1=1 is once again sufficient to select JADD to be the next address word NADD.

At this point, all locations in the memory 14 from ADDR0 to ADDRN inclusive have been read, and the word held by the flip-flops 78 of the instruction register 18 will correspond to an expected signature word if the intended contents of the memory 14 were correctly stored and retrieved. Conventionally, after the memory test sequence the signature word would be communicated to an external test apparatus for comparison with the expected signature. Such communication must in general be by means of a data path which will generally have to be provided specially for that purpose. In the device described herein, however, the signature word remains latched in the instruction register 18 when the device reverts to normal mode, and is decoded as a regular instruction by the decoder 21 (step 304). By this means, the signature word can itself control subsequent operation of the processing device.

Figure 4:
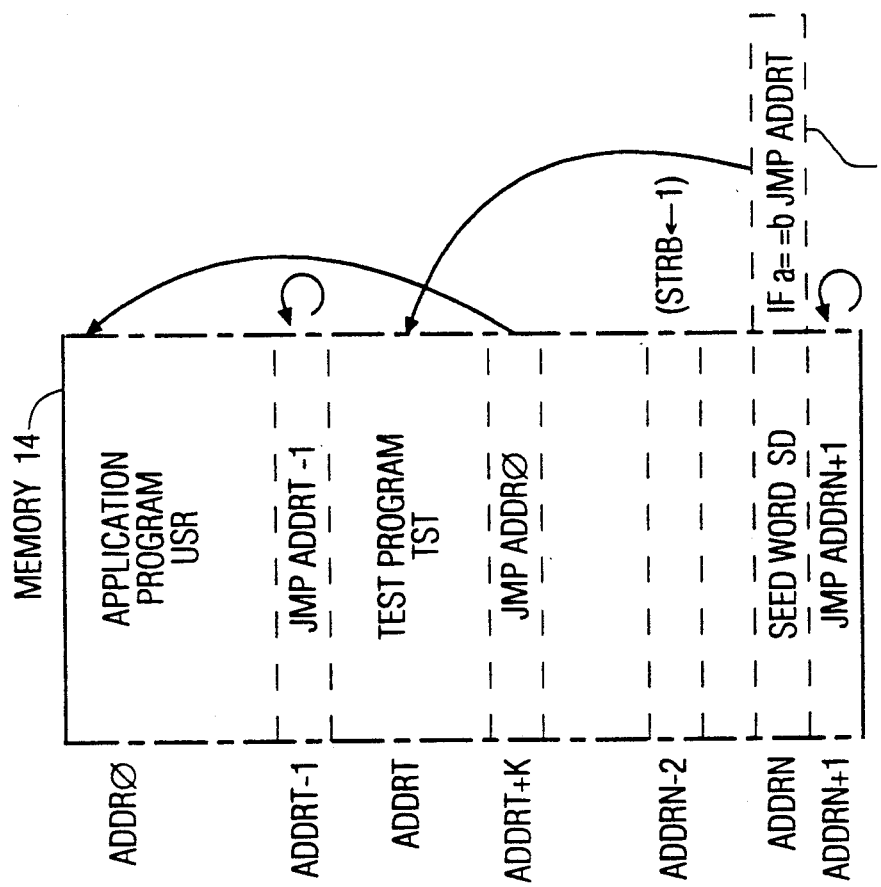
FIG. 4 shows an arrangement of data in a memory of the device of FIG. 1 after programming.

FIG. 4 presents one possible arrangement of data in the memory 14 to take advantage of the novel memory self-test facility. Addresses ADDR0 through ADDRN+1 are indicated to the left of the memory map. A user area USR begins at location ADDR0 and contains a main application program for execution in normal mode, with any associated data. For the sake of example, location ADDR0 will be assumed to be the entry point for execution of this application program.

A smaller area TST begins at location ADDRT and contains a test program which is added to the application program data for the purpose of self-testing of the device after the memory signature word has been generated. Location ADDRT forms the entry point for this test program. The single location ADDRN contains a seed word SD stored for the purpose of the signature generation.

When memory test mode is initiated by a signal TINIT=1 as described above, the contents of all addresses ADDR0 to ADDRN are combined in the instruction register 18 (IR/LFSR) to form a signature word SIG. The location ADDRN−2 is marked in FIG. 4, at which location the address register 10 generates the positive strobe signal STRB=1. Two cycles later, when the address ADDR is exactly ADDRN, the device reverts to normal mode, as described above and the signature word SIG contained in the register 18 at this time (not the seed word SD) falls to be executed as a normal program instruction.

By suitable choice of the seed word SD, the expected signature word SIG forms a jump instruction "JMP ADDRT" transferring control to the entry point of the test program at ADDRT. On the assumption that long instruction words are provided, including fields for one or more operands, the example signature word SIG is made a conditional jump instruction "IF a==b JMP ADDRT", including two immediate operands, a and b. The conditional jump can be used to ensure that as many bits as possible of the long signature word contribute to the error checking action. If the signature word does not represent a jump to address ADDRT, or if there is an error in the immediate operands a and b represented within the word, the test program at ADDRT will not be executed.

One function of the test program in area TST might be to transmit a signal via the output port 25, for example to a display device or a host processing device, confirming the generation of the correct signature word. In an application where the processing device is embedded in some specialized piece of equipment, for example, communicating the memory test result via the existing output port and external circuitry may avoid the need for special circuitry (internal or external) dedicated to the memory test function. The test program TST may further include routines for testing the various facilities of the functional unit 24. Such a program need occupy very little space in the memory 14, as described in the references. In the example of FIG. 4, the test program ends at location ADDRT+K, where a jump instruction "JMP ADDR0" transfers control automatically to the entry point ADDR0 of the main application program stored in the area USR.

It may be noted that, if the memory contents are not correct, the device will attempt to execute some unknown generated signature word as a program instruction. While the results of this are unpredictable, the data can generally be arranged such that the probability that an incorrect signature will nevertheless lead to the expected output signal is negligible. A simple measure for this purpose is to store guard instructions at certain points in the memory. One guard instruction is a jump instruction "JMP ADDRT−1" stored at the location ADDRT−1 immediately before the entry point ADDRT of the test program. Should control ever pass to location ADDRT−1, the device will become trapped in an endless, silent loop. This ensures that the test program can only be entered by a jump directly to the entry point at ADDRT itself. Similarly, in case no jump is effected on reversion to normal mode, the location ADDRN+1 has been loaded with a jump instruction "JMP ADDRN+1", to trap the device in a similar endless, silent loop. The user (or external circuitry) can then recognize a prolonged lack of output signals as an indication that the device is faulty. It may be noted that the location ADDRN+1 itself is not subject to the signature test. The probability that this will cause a misleading test result is judged to be negligible.

Figure 5:
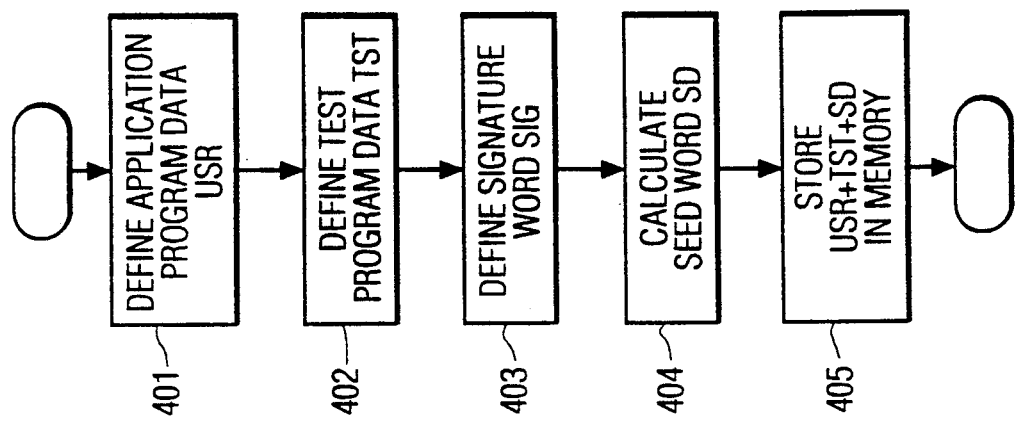
FIG. 5 is a flowchart illustrating a method of programming a processing device in accordance with the invention.

Although the signature word is a complex function of a large number of data words in the areas USR and TST, the seed word SD can be calculated to force the expected signature word to equal any desired instruction for execution. FIG. 5 represents a method of programming a processing device, by which this feature may be exploited.

The method of FIG. 5 begins in step 401 with the definition of the application program data for storage in the user area USR of the memory 14. This data may be regarded as random and fixed, since the memory test feature is not intended to modify the primary function of the device, whatever that may be. The next step 402 defines the test program data TST, which may also be considered as random and fixed, since it too has its own function to perform. Defining the test program data TST (and hence its entry point ADDRT) also has the effect of defining at least part of the instruction which it is desired that the signature word SIG should form on completion of the memory test. The blocks of data USR and TST are concatenated and in step 403 the signature word for that data is calculated, by hand or by computer, just as it would be done by the LFSR (instruction register 18, MS=1 in the processing device, but only up to the penultimate location, ADDRN−1. It is then a simple matter to calculate (step 404) what seed word SD needs to be stored in the last location ADDRN to get from this penultimate signature word to the desired final signature word SIG.

As an example, consider the eight-bit LFSR represented in FIG. 2 (MS=1). Suppose that the desired instruction word to be formed by the final signature word SIG is binary 10101110 (msb . . . lsb). Suppose further that the penultimate signature word generated from the data USR and TST, up to location ADDRN−1, is found to be binary 10110010. When this penultimate signature word is contained in the flip-flops 78 of the LFSR, the feedback signal FB generated by the EXOR gates 81–83 is FB=0.EXOR.(1.EXOR.(-1.EXOR.0))=0. The msb of the desired final signature word SIG is 1, which is $\overline{FB}$. Since FB.EXOR.1=$\overline{FB}$, the msb of the required seed word is therefore 1. The remaining bits of the seed word are determined by EX-OR-ing the corresponding bit of the desired final signature word SIG with the next more significant bit of the penultimate signature word. The required seed word turns out to be 11110111 (msb . . . lsb).

In step 405 the concatenation of the data blocks USR, TST and SD is programmed into the memory 14 of one or more processing devices. The programming may be done electrically, as when the memory is a PROM (programmable read-only memory) containing fusible links, or it may be done in a factory by a depositing an appropriate metallization pattern (mask-programmed ROM). Once programmed, the device can be operated in normal and memory test modes as described above with reference to FIGS. 1 to 4.

Those skilled in the art will readily appreciate that the invention is applicable in many types of programmed and microprogrammed processing devices having either general or specialized functions, including communications processors, display processors, signal processors and so forth. The invention may be particularly beneficial where the data stored in the memory comprises microprogram data, since these data are rarely accessible to the external world by any existing data paths.

Those skilled in the art will also appreciate that the various features and elements of the embodiment described may be varied as required by the designer of a programmable processing device. In other embodiments, for example, the memory test mode might be initiated automatically when power is applied to the device, or by a special instruction within the application program. Such embodiments could eliminate the need for the external test signal input 50. Alternatively, the test input 50 could serve also as one of the normal terminals of the device, by making the memory test initiation dependent on an abnormal signal on that terminal, for example a voltage beyond the valid logic levels. While the word length is only eight bits in the embodiment of FIG. 2, the data words and hence the instruction register will often be more than eight bits wide. For example, the paper by Ligthart et al. cited above, describes an implementation of an input/output device controlled by 38-bit instruction words.

The seed word SD could be stored at any location in the memory 14, or could be entered directly into the instruction register 18 in the reset step 306, instead of being stored in the memory 14 with the program data. The signature generating means need not comprise a linear feedback shift register. The article "Boundary Scan with Built-in Self-test" by C. S. Gloster and F. Brglez in IEEE Design and Test of Computers, February, 1989, pp. 36–44, describes an alternative signature generator called a Cellular Automata Register (CAR). The CAR may be more convenient than an LFSR when the register has many bits, since feedback from lsb to msb is not required. The signature generating means need not be formed by a modified instruction register, so long as means are provided for supplying the final signature word automatically to the decoding means for execution as an instruction. Different address generating means could be provided for addressing all locations systematically during the memory testing. For example, a pseudo-random addressing sequence could be generated by a second linear feedback shift register.

We claim:

1. A processing device comprising:
   a program memory for storage of data including program instructions for controlling the device;
   instruction decoding means for controlling operation of the processing device in accordance with instructions read from the program memory;
   memory test sequencing means for implementing a memory test sequence wherein all locations in a to-be-tested part of the program memory are systematically addressed to cause readout of the data stored in that part of the program memory;
   signature generating means for combining the data read from the program memory during said memory test sequence to generate a signature word; and
   means for supplying the generated signature word to the instruction decoding means at the end of the memory test sequence for execution by the processing device as a program instruction,
   whereby the processing device is a programmable processor whose program memory is self-tested without communication of the signature word to an external testing circuit.

2. A processing device as claimed in claim 1 wherein the signature generating means is formed during the memory test sequence by temporary reconfiguration of at least a part of the instruction decoding means.

3. A processing device as claimed in claim 2 wherein:
the instruction decoding means includes an instruction register for receiving and storing data read from the memory; and
in the temporarily reconfigured instruction decoding means forming the signature generating means, the instruction register forms part of a linear feedback shift register.

4. A processing device as claimed in claim 3 wherein:
the instruction decoding means is responsive to a jump type of instruction specifying the location of program instructions to be executed subsequently; and
the memory test sequencing means includes means for inhibiting the response to jump instructions during the memory test sequence.

5. A processing device as claimed in claim 2 wherein:
the instruction decoding means is responsive to a jump type of instruction specifying the location of program instructions to be executed subsequently; and
the memory test sequencing means includes means for inhibiting the response to jump instructions during the memory test sequence.

6. A processing device as claimed in claim 2 wherein the memory test sequencing means is arranged to initiate the test sequence in response to an externally generated control signal applied to the device.

7. A processing device as claimed in claim 1 wherein the memory test sequencing means is arranged to initiate the test sequence in response to an externally generated control signal applied to the device.

8. A method of programming a processing device, the method comprising:
receiving given data for storage in a program memory of the device;
selecting as a desired signature word a word suitable for execution as a program instruction for controlling the operation of the processing device;
calculating from the given data a seed word which, when combined with the given data by a signature generating means of the device during a memory test sequence, will cause generation of the desired signature word;
storing the given data in the program memory of the processing device; and
storing the seed word in the processing device for supply to the signature generating means during the memory test sequence.

9. A method as claimed in claim 8 wherein the seed word is stored together with the given data in the program memory of the processing device.

10. A method as claimed in claim 9 wherein the desired signature word constitutes a jump instruction for causing the processing device to execute program instructions included in the given data.

11. A method as claimed in claim 8 wherein the desired signature word constitutes a jump instruction for causing the processing device to execute program instructions included in the given data.

* * * * *